(12) United States Patent
Mizukami et al.

(10) Patent No.: US 10,872,974 B2
(45) Date of Patent: Dec. 22, 2020

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Makoto Mizukami, Ibo Hyogo (JP); Takuma Suzuki, Himeji Hyogo (JP); Yujiro Hara, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/278,838

(22) Filed: Feb. 19, 2019

(65) Prior Publication Data
US 2020/0091334 A1 Mar. 19, 2020

(30) Foreign Application Priority Data
Sep. 15, 2018 (JP) .................................. 2018-173138

(51) Int. Cl.
*H01L 29/15* (2006.01)
*H01L 29/78* (2006.01)
(Continued)

(52) U.S. Cl.
CPC ...... *H01L 29/7804* (2013.01); *H01L 29/0615* (2013.01); *H01L 29/1608* (2013.01); *H01L 29/7813* (2013.01)

(58) Field of Classification Search
CPC ............. H01L 29/7804; H01L 29/0615; H01L 29/1608; H01L 29/7813
See application file for complete search history.

(56) References Cited

U.S. PATENT DOCUMENTS 7,928,470 B2   4/2011   Yamaguchi et al.
9,214,458 B2   12/2015  Hino et al.
(Continued)

FOREIGN PATENT DOCUMENTS

JP   H01-051664 B2   11/1989
JP       4197400 B2   12/2008
(Continued)

OTHER PUBLICATIONS

Masayuki Furuhashi et al., "Practical applications of SiC-MOSFETs and further developments," Semiconductor Science and Technology 31 (2016), pp. 1-10.

(Continued)

*Primary Examiner* — Phuc T Dang
(74) *Attorney, Agent, or Firm* — White & Case LLP

(57) ABSTRACT

A semiconductor device according to an embodiment includes a silicon carbide layer having first and second planes; first and second trenches extending in a first direction; first and second gate electrodes; a first silicon carbide region of a first conductivity type; a plurality of second silicon carbide regions of a second conductivity type between the first silicon carbide region and the first plane, located between the first trench and the second trench, and separated from each other in the first direction; a fourth silicon carbide region of the second conductivity type between two of the second silicon carbide regions and contacting the second silicon carbide region; a fifth silicon carbide region of the second conductivity type between the two second silicon carbide regions and contacting the second silicon carbide region; a first electrode contacting the first silicon carbide region; and a second electrode.

10 Claims, 15 Drawing Sheets

(51) Int. Cl.
  *H01L 29/06* (2006.01)
  *H01L 29/16* (2006.01)

(56) References Cited

U.S. PATENT DOCUMENTS

| | | | |
|---|---|---|---|
| 9,252,211 | B2 | 2/2016 | Uchida et al. |
| 9,391,190 | B2 | 7/2016 | Watanabe et al. |
| 9,577,073 | B2 | 2/2017 | Esteve et al. |
| 9,691,759 | B2 | 6/2017 | Uchida et al. |
| 9,786,778 | B1 | 10/2017 | Morizuka |
| 9,812,537 | B2 | 11/2017 | Nakano |
| 2016/0163852 | A1* | 6/2016 | Siemieniec ....... H01L 29/42368 257/77 |
| 2018/0076294 | A1 | 3/2018 | Nakano |
| 2018/0076316 | A1* | 3/2018 | Kinoshita ........... H01L 29/0623 |
| 2018/0097103 | A1 | 4/2018 | Sadamatsu et al. |
| 2019/0081624 | A1* | 3/2019 | Zhang ................ H01L 29/0615 |
| 2019/0088774 | A1 | 3/2019 | Mizukami |
| 2019/0165164 | A1* | 5/2019 | Kobayashi .......... H01L 29/7813 |

FOREIGN PATENT DOCUMENTS

| | | |
|---|---|---|
| JP | 5098300 B2 | 12/2012 |
| JP | 5533104 B2 | 6/2014 |
| JP | 2014-132600 A | 7/2014 |
| JP | 5815882 B2 | 11/2015 |
| JP | 2016-115936 A | 6/2016 |
| JP | 6021032 B2 | 11/2016 |
| JP | 6058228 B1 | 1/2017 |
| JP | 6104743 B2 | 3/2017 |
| JP | 2017-69551 A | 4/2017 |
| JP | 2017-112161 A | 6/2017 |
| JP | 6143490 B2 | 6/2017 |
| JP | 2017-216297 A | 12/2017 |
| JP | 2019-57573 A | 4/2019 |
| WO | 2016-042621 A1 | 3/2016 |

OTHER PUBLICATIONS

Yusuke Kobayashi et al., "Body PiN diode inactivation with low on-resistance achieved by a 1.2 kV-class 4H-SiC Switch-MOS," IEDM17-211-214, IEEE 2017.

S. Harada, "1200 V SIC IE-UMOSFET with Low On-Resistance and High Threshold Voltage," Materials Science Forum vol. 897, Silicon Carbide and Related Materials, 2016, pp. 497-500.

Yusuke Kobayashi et al., "Low on-rsistance SiC trench MOSFET with suppressed short channel effect by halo implantation," ICSCRM 2017, pp. 1-3.

Dethard Peters et al., "Performance and Ruggedness of 1200V SiC—Trench—MOSFET," Proceedings of the 29th International Symposium on Power Semiconductor Devices & ICs, 2017, pp. 239-242.

Aiko Ichimura et al., "4H-SiC Trench MOSFET with Ultra-Low On-Resistance by Using Miniaturization Technology," Materials Science Forum vol. 924, Silicon Carbide and Related Materials, 2017, pp. 707-710.

Shinya Kyogoku et al., "Role of Trench Bottom Shielding Region on Switching Characteristics of 4H-SiC Double-Trench MOSFETs," Material Science Forum vol. 924, Silicon Carbide and Related Materials, 2017, pp. 748-751.

* cited by examiner

SEMICONDUCTOR DEVICE

CROSS-REFERENCE TO RELATED APPLICATION

This application is based upon and claims the benefit of priority from Japanese Patent Application No. 2018-173138, filed on Sep. 15, 2018, the entire contents of which are incorporated herein by reference.

FIELD

Embodiments described herein relate generally to a semiconductor device.

BACKGROUND

A silicon carbide (SiC) is expected as a material for next generation semiconductor devices. In comparison with silicon, the silicon carbide has superior physical properties such as a band gap of about 3 times, a breakdown field strength of about 10 times, and a thermal conductivity of about 3 times. By utilizing these characteristics, for example, it is possible to realize a metal oxide semiconductor field effect transistor (MOSFET) which can operate at a high breakdown voltage, a low loss, and a high temperature.

A vertical type MOSFET using silicon carbide has a pn junction diode as a parasitic built-in diode. For example, the MOSFET is used as a switching element connected to an inductive load. In this case, even when the MOSFET is turned off, by using a pn junction diode, it is possible to allow a reflux current to flow.

However, when the reflux current is allowed to flow by using a pn junction diode, stacking faults grow in the silicon carbide layer due to the recombination energy of carriers, and thus, there is a concern that the on-resistance of the MOSFET may increase. The increase in the on-resistance of the MOSFET causes degradation in the reliability of the MOSFET.

In addition, as a structure for reducing the on-resistance of a MOSFET using silicon carbide, there is a trench gate type MOSFET in which a gate electrode is provided in a trench. In the trench gate type MOSFET, the on-resistance is reduced by increasing the channel density per unit area.

However, in the trench gate type MOSFET, due to the structure, a high electric field is applied to the gate insulating layer, in particular, at the bottom of the trench. Therefore, there is a concern that the dielectric breakdown voltage of the gate insulating layer may decreases. The decrease in the gate dielectric breakdown voltage causes degradation in the reliability of the MOSFET.

DETAILED DESCRIPTION

Figure 1:
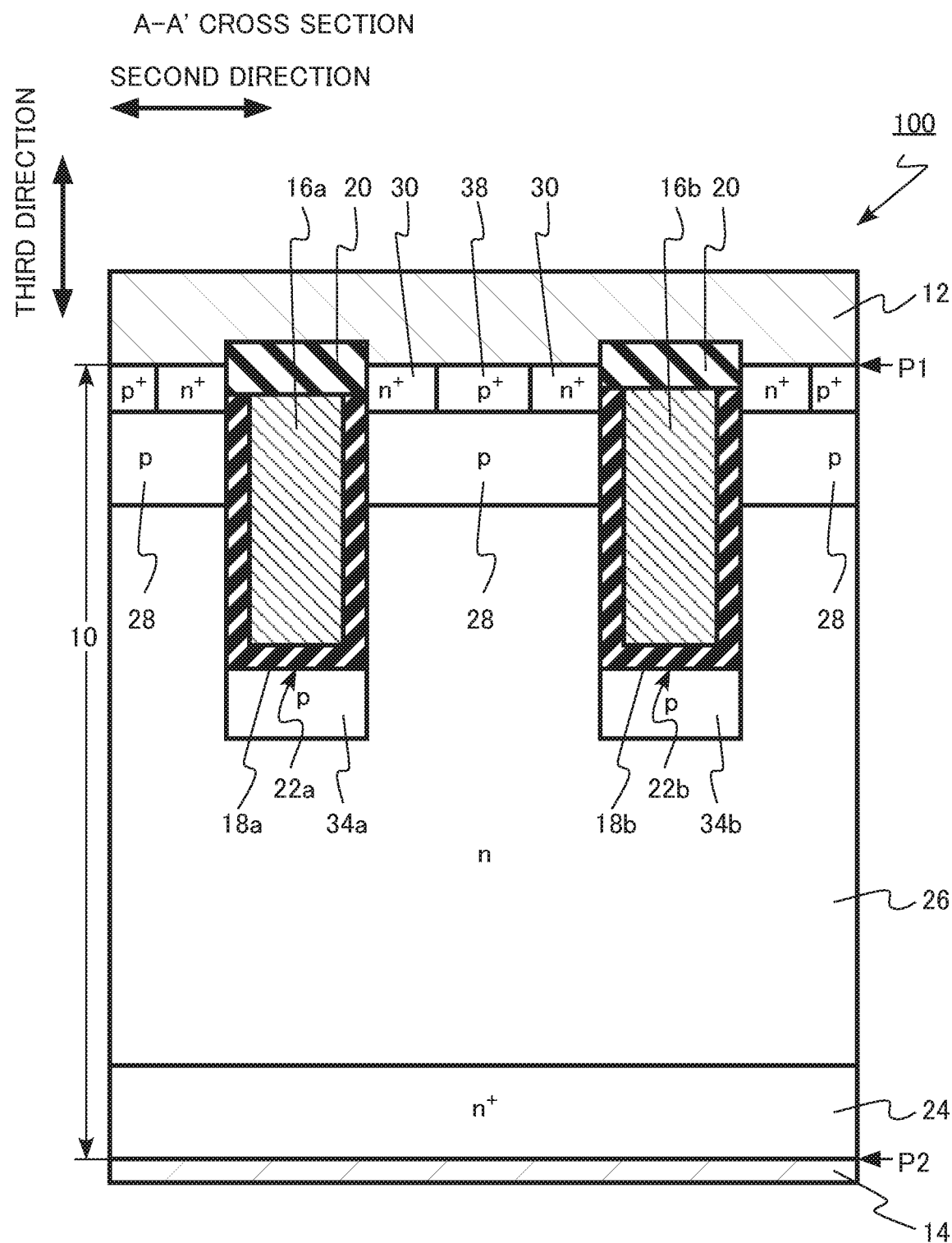
FIG. 1 is a schematic cross-sectional view of a semiconductor device according to a first embodiment.

Hereinafter, embodiments of the invention will be described with reference to the drawings. In addition, the following description, the same or similar members or the like are denoted by the same reference numerals, and the description of the members or the like once described may be omitted as appropriate.

In addition, in the following description, when the notations $n^+$, n, $n^-$, $p^+$, p, and $p^-$ are used, these notations indicate relative magnitude of impurity concentration in respective conductivity types. That is, $n^+$ indicates that the n-type impurity concentration is relatively higher than that of n, and $n^-$ indicates that the n-type impurity concentration is relatively lower than that of n. In addition, $p^+$ indicates that the p-type impurity concentration is relatively higher than that of p, and $p^-$ indicates that the p-type impurity concentration is relatively lower than that of p. In addition, sometimes, the $n^+$-type and the $n^-$-type may be simply described as n-type, and the $p^+$-type and the $p^-$-type may be simply described as the p-type.

The impurity concentration can be measured by secondary ion mass spectrometry (SIMS), for example. In addition, a relative magnitude of an impurity concentration may also be determined from a magnitude of a carrier concentration obtained by, for example, scanning capacitance microscope (SCM). In addition, a distance such as a depth of an impurity region can be obtained by, for example, SIMS. In addition, the distance such as a width and a depth of an impurity region can be obtained from, for example, an SCM image.

The shapes of trenches, thicknesses of insulating layers, and the like may be measured on, for example, a transmission electron microscope (TEM) image.

First Embodiment

A semiconductor device according to a first embodiment includes a silicon carbide layer having a first plane and a second plane opposite to the first plane; a first trench provided in the silicon carbide layer and extending in a first direction; a second trench provided in the silicon carbide layer and extending in the first direction; a first gate electrode provided in the first trench; a second gate electrode provided in the second trench; a first gate insulating layer provided between the first gate electrode and the silicon carbide layer; a second gate insulating layer provided between the second gate electrode and the silicon carbide layer; a first silicon carbide region of a first conductivity type provided in the silicon carbide layer; a plurality of second silicon carbide regions of a second conductivity type provided in the silicon carbide layer, the second silicon carbide regions located between the first silicon carbide region and the first plane, the second silicon carbide regions located between the first trench and the second trench, and the second silicon carbide regions separated from each other in the first direction; a third silicon carbide region of the first conductivity type provided in the silicon carbide layer and the third silicon carbide region located between one of the second silicon carbide regions and the first plane; a fourth silicon carbide region of the second conductivity type provided in the silicon carbide layer, the fourth silicon carbide region located between two of the second silicon carbide regions, the fourth silicon carbide region located between the first trench and the first silicon carbide region, and the fourth silicon carbide region being in contact with the two of the second silicon carbide regions; a fifth silicon carbide region of the second conductivity type provided in the silicon carbide Layer, the fifth silicon carbide region located between the two of the second silicon carbide regions, the fifth silicon carbide region located between the second trench and the first silicon carbide region, and the fifth silicon carbide region being in contact with the two of the second silicon carbide regions; a first electrode provided on a side of the first plane of the silicon carbide layer, the first electrode being in contact with the third silicon carbide region, and the first electrode being in contact with the first silicon carbide region between the two of the second silicon carbide regions; and a second electrode provided on a side of the second plane of the silicon carbide layer.

Hereinafter, a case where the first conductivity type is n-type and the second conductivity type is p-type will be described as an example.

FIG. 1 is a schematic cross-sectional view of a semiconductor device according to the first embodiment. FIG. 1 illustrates a cross section taken along line A-A' of FIG. 2. FIG. 1 is a cross-sectional view of a transistor region described later.

Figure 2:
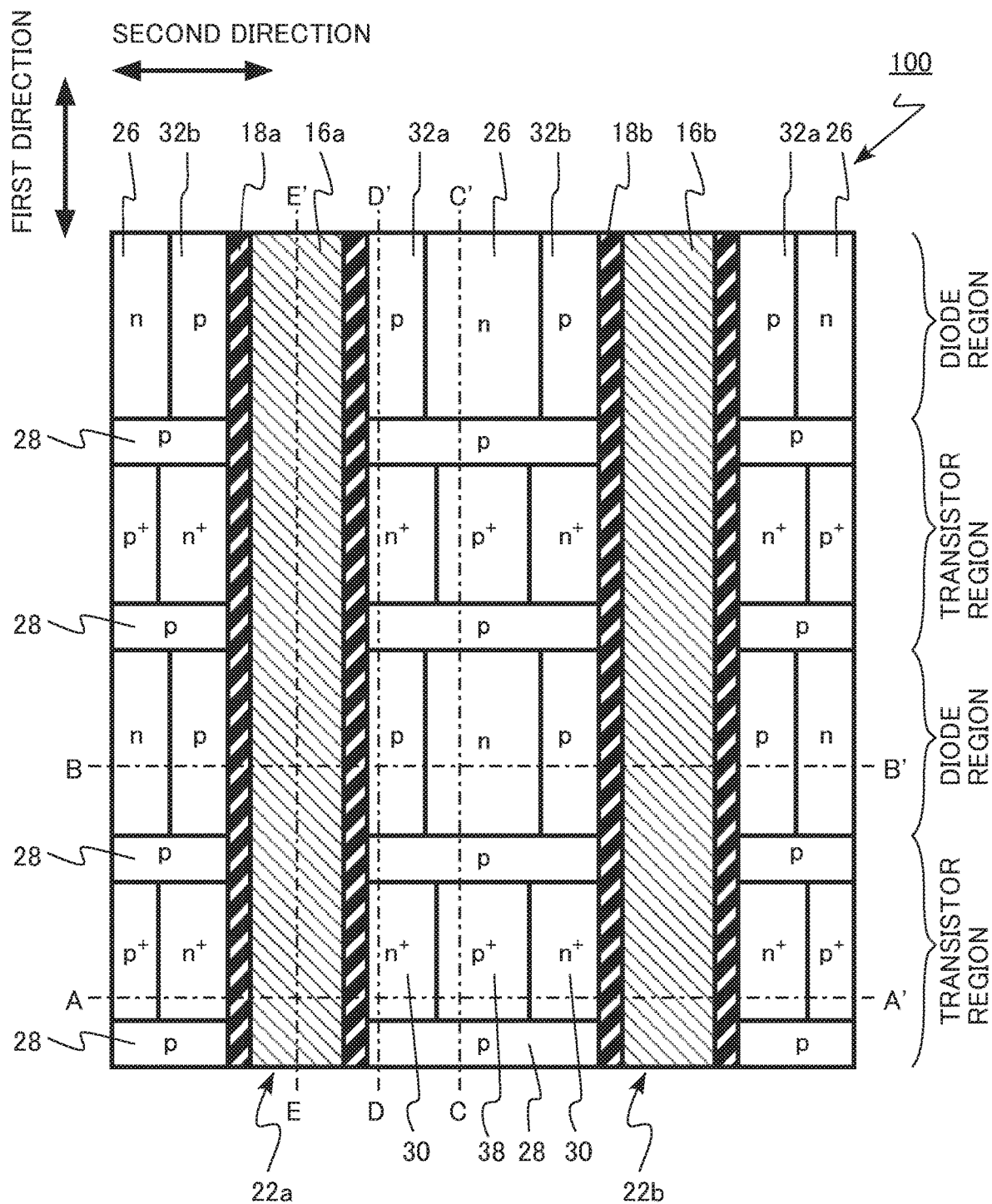
FIG. 2 is a schematic plan view of the semiconductor device according to the first embodiment.

FIG. 2 is a schematic plan view of the semiconductor device according to the first embodiment. FIG. 2 is a plan view of the first plane (P1 in FIG. 1) of FIG. 1.

Figure 3:
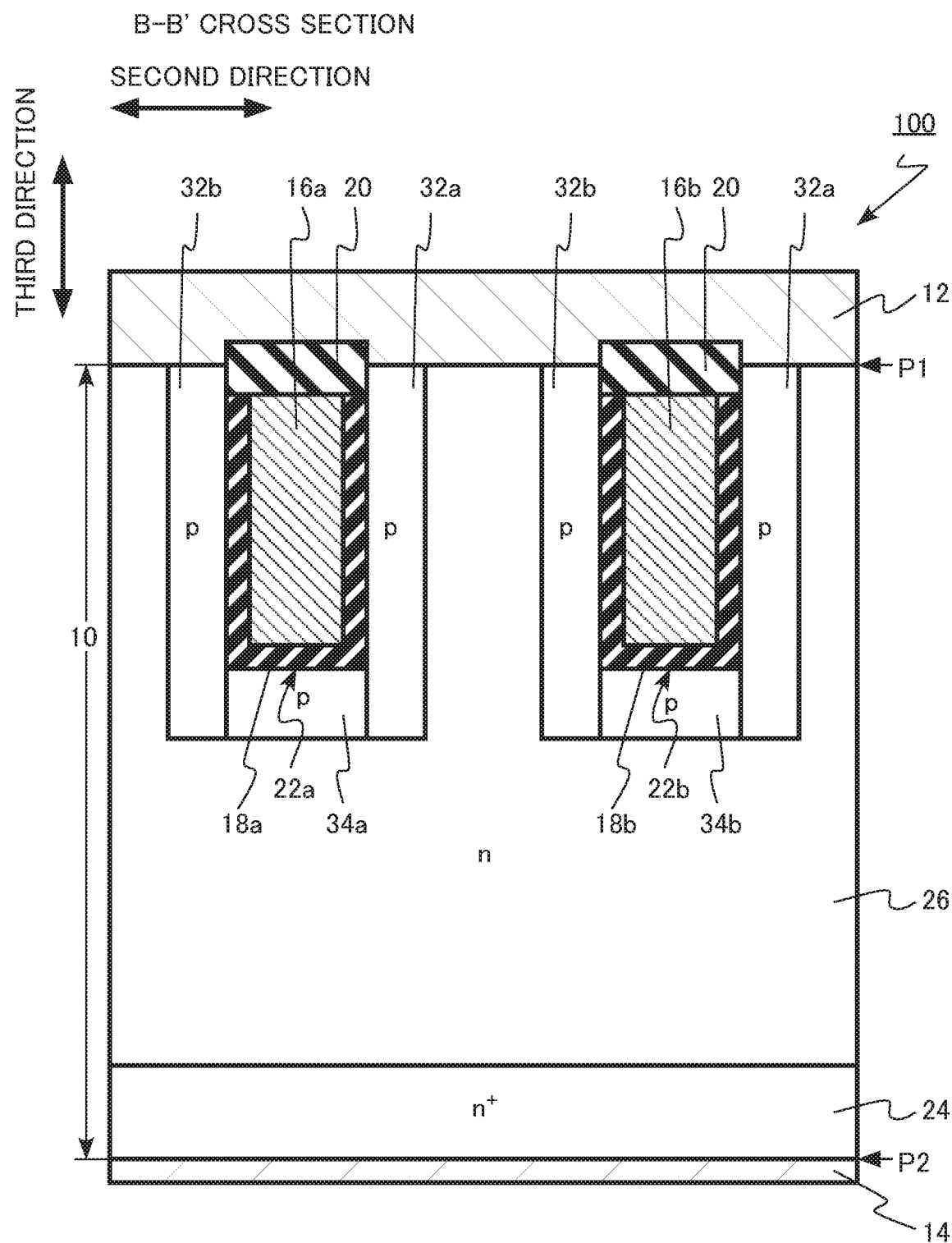
FIG. 3 is a schematic cross-sectional view of the semiconductor device according to the first embodiment.

FIG. 3 is a schematic cross-sectional view of the semiconductor device according to the first embodiment. FIG. 3 illustrates a cross section taken along line B-B' of FIG. 2. FIG. 3 is a cross-sectional view of a diode region described later.

Figure 4:
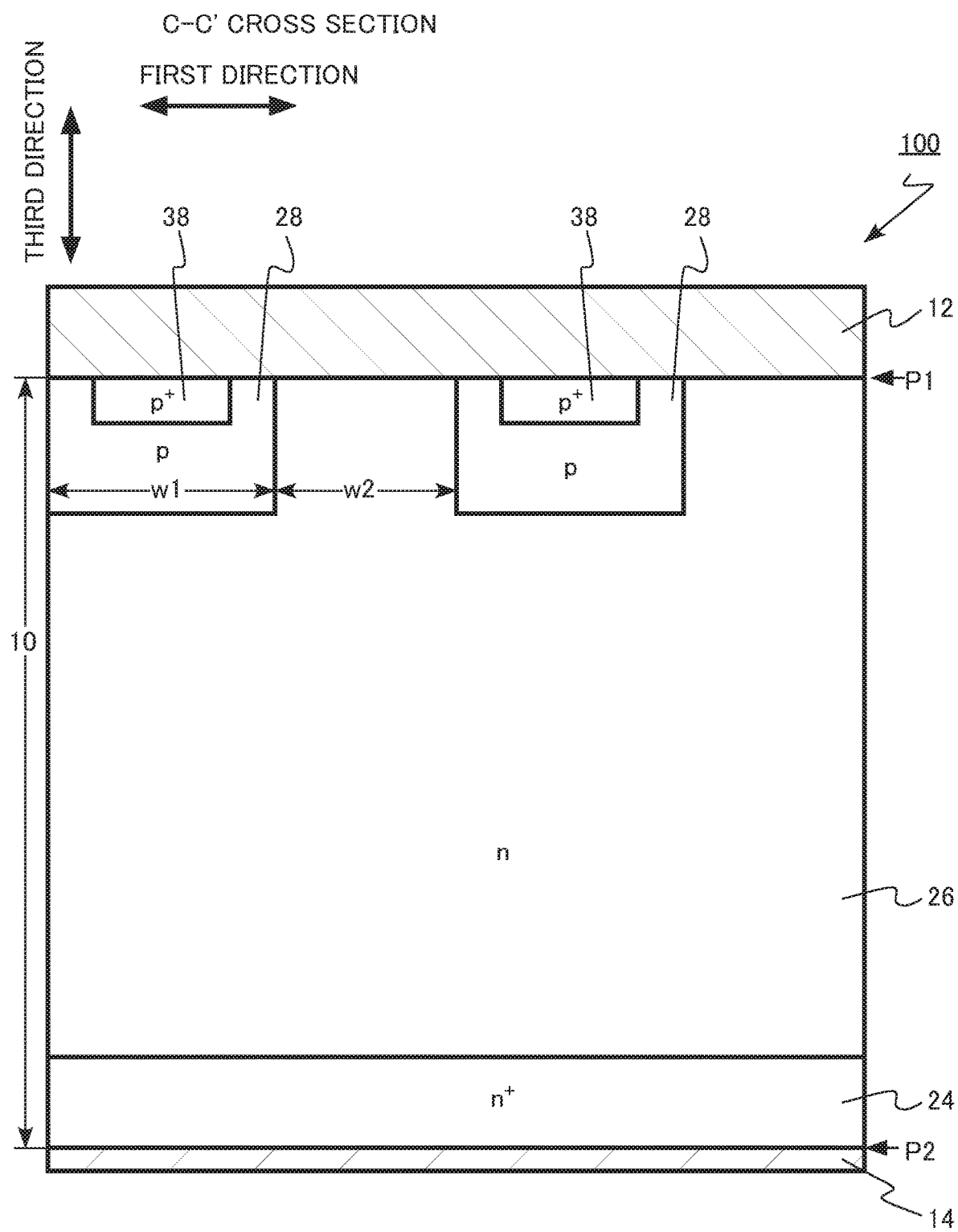
FIG. 4 is a schematic cross-sectional view of the semiconductor device according to the first embodiment.

FIG. 4 is a schematic cross-sectional view of the semiconductor device according to the first embodiment. FIG. 4 illustrates a cross section taken along line C-C' of FIG. 2.

Figure 5:
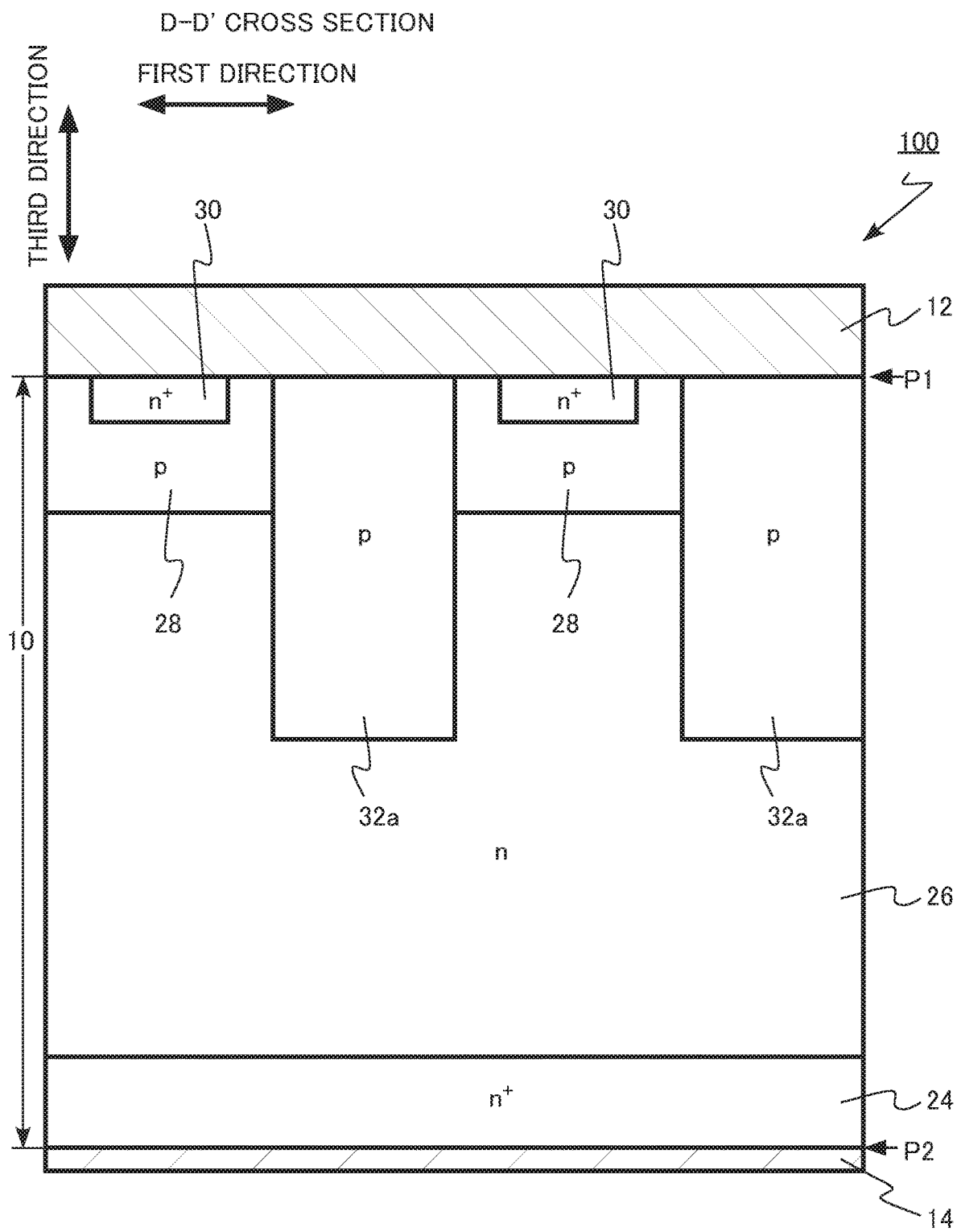
FIG. 5 is a schematic cross-sectional view of the semiconductor device according to the first embodiment.

FIG. 5 is a schematic cross-sectional view of the semiconductor device according to the first embodiment. FIG. 5 illustrates a cross section taken along line D-D' of FIG. 2.

Figure 6:
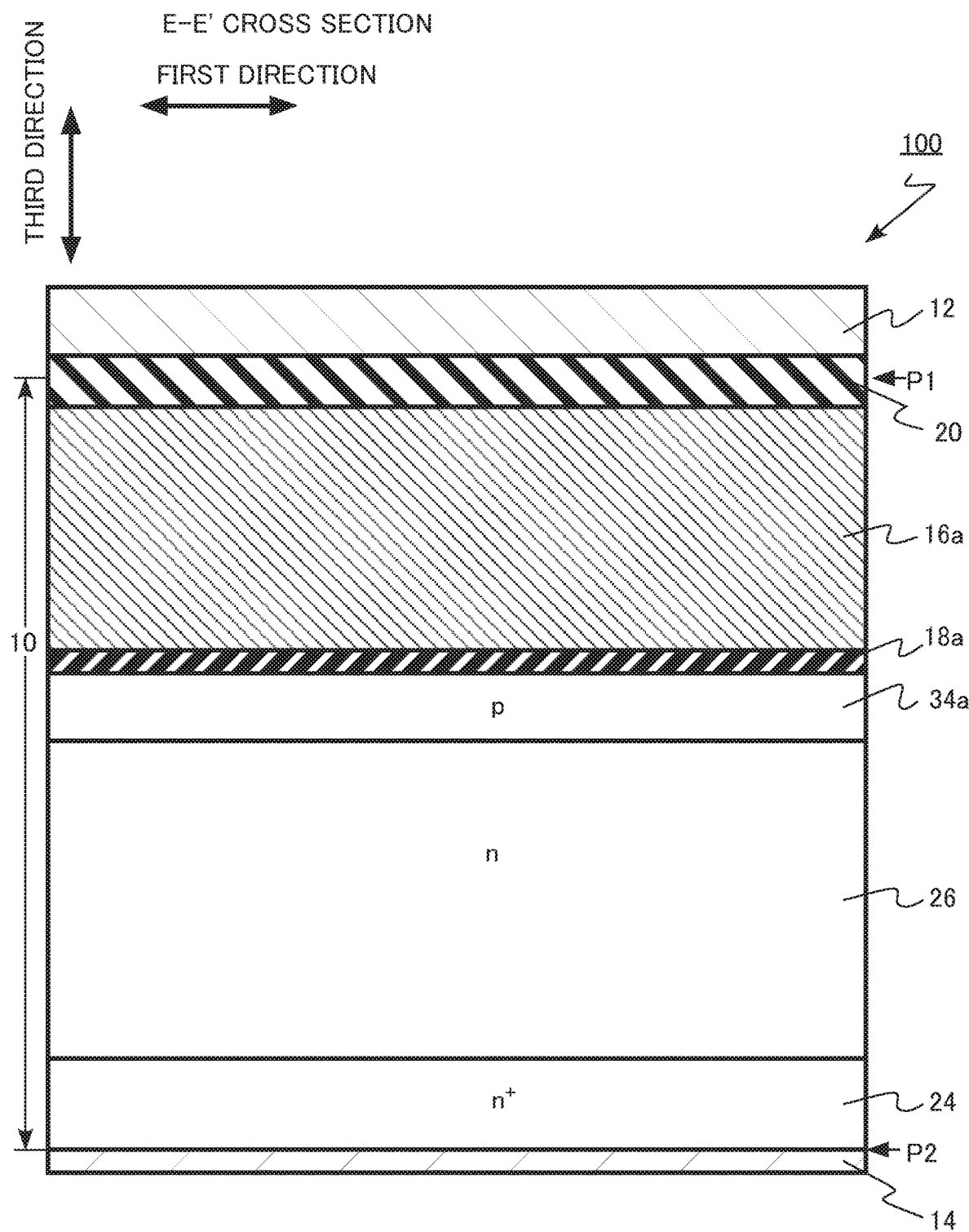
FIG. 6 is a schematic cross-sectional view of the semiconductor device according to the first embodiment.

FIG. 6 is a schematic cross-sectional view of the semiconductor device according to the first embodiment. FIG. 6 illustrates a cross section taken along line E-E' of FIG. 2. FIG. 6 is a cross-sectional view taken along a first trench 22a to be described later.

The semiconductor device according to the first embodiment is a trench gate type vertical MOSFET 100 using silicon carbide. The MOSFET 100 is an n-channel MOSFET using electrons as carriers. The MOSFET 100 of the semiconductor device according to the first embodiment includes a Schottky barrier diode (SBD) as a built-in diode.

In the MOSFET 100, as illustrated in FIG. 2, the transistor region and the diode region are alternately arranged in the first direction. A MOSFET structure is formed in the transistor region. An SBD structure is arranged in the diode region.

The MOSFET 100 includes a silicon carbide layer 10, a source electrode 12 (first electrode), a drain electrode 14 (second electrode), a first gate electrode 16a, a second gate electrode 16b, a first gate insulating layer 18a, a second gate insulating layer 18b, an interlayer insulating layer 20, a first trench 22a, and a second trench 22b.

In the silicon carbide layer 10, an $n^+$-type drain region 24, an n-type drift region 26 (first silicon carbide region), a p-type body region 28 (second silicon carbide region), an $n^+$-type source region 30 (third silicon carbide region), a p-type first connection region 32a (fourth silicon carbide region), a p-type second connection region 32b (fifth silicon carbide region), a p-type first electric field relaxation region 34a (sixth silicon carbide region), a p-type second electric field relaxation region 34b (seventh silicon carbide region), and a $p^+$-type contact region 38 (tenth silicon carbide region) are provided.

The silicon carbide layer 10 is single crystal SiC. The silicon carbide layer 10 is, for example, 4H—SiC.

The silicon carbide layer 10 has a first plane ("P1" in FIG. 1) and a second plane ("P2" in FIG. 1) opposite to the first plane. Hereinafter, the first plane P1 may be referred to as a front surface, and the second plane P2 may be referred to as a back surface. In addition, hereinafter, the "depth" denotes the depth based on the first plane P1.

In FIGS. 1, 2, 3, 4, 5, and 6, the first direction and the second direction are parallel to the first plane P1 and the second plane P2. The third direction is perpendicular to the first plane P1 and the second plane P2. The second direction is perpendicular to the first direction.

For example, the first plane P1 is a plane inclined at 0 degrees or more and 8 degrees or less with respect to the (0001) plane. That is, the first plane is a plane of which the normal line is inclined at 0 degrees or more and 8 degrees or less with respect to the c axis in the [0001] direction. In other words, the off angle with respect to the (0001) plane is 0 degrees or more and 8 degrees or less. In addition, the second plane P2 is, for example, a plane inclined at 0 degrees or more and 8 degrees or less with respect to the (000-1) plane.

The (0001) plane is called a silicon face. The (000-1) plane is called a carbon face. The inclination directions of the first plane P1 and the second plane P2 are, for example, the [11-20] direction. The [11-20] direction is an a-axis direction. In FIG. 1, for example, the second direction illustrated in the figure is the a-axis direction.

The first trench 22a and the second trench 22b are provided in the silicon carbide layer 10. The first trench 22a and the second trench 22b extend in the first direction as illustrated in FIG. 2. A plurality of trenches including the first trench 22a and the second trench 22b are repeatedly arranged in the second direction. The repetition pitch of the trenches in the second direction is, for example, 2 µm or more and 6 µm or less. The depths of the first trench 22a and the second trench 22b are, for example, 1 µm or more and 2 µm or less.

The first gate electrode 16a is located in the first trench 22a. The first gate electrode 16a is provided between the source electrode 12 and the drain electrode 14. The first gate electrode 16a extends in the first direction.

The second gate electrode 16b is located in the second trench 22b. The second gate electrode 16b is provided between the source electrode 12 and the drain electrode 14. The second gate electrode 16b extends in the first direction.

The first gate electrode 16a and the second gate electrode 16b are conductive layers. The first gate electrode 16a and the second gate electrode 16b are, for example, polycrystalline silicon containing p-type impurities or n-type impurities.

The first gate insulating layer 18a is provided between the first gate electrode 16a and the silicon carbide layer 10. The first gate insulating layer 18a is provided at least between each region of the source region 30, the body region 28, and the drift region 26 and the first gate electrode 16a.

The second gate insulating layer 18b is provided between the second gate electrode 16b and the silicon carbide layer 10. The second gate insulating layer 18b is provided at least between each region of the source region 30, the body region 28, and the drift region 26 and the second gate electrode 16b.

The first gate insulating layer 18a and the second gate insulating layer 18b contain, for example, a silicon oxide, a silicon nitride, or an aluminum oxide. The first gate insulating layer 18a and the second gate insulating layer 18b are, for example, a stacked film of films containing any of the above-mentioned materials. It is preferable that the first gate insulating layer 18a and the second gate insulating layer 18b contain silicon oxide containing nitrogen.

The interlayer insulating layer 20 is provided on the first gate electrode 16a and the second gate electrode 16b. The interlayer insulating layer 20 includes, for example, a silicon oxide.

The n⁺-type drain region 24 is provided on the back surface side of the silicon carbide layer 10. The drain region 24 contains, for example, nitrogen (N) as n-type impurities. The n-type impurity concentration of the drain region 24 is, for example, $1\times10^{18}$ cm$^{-3}$ or more and $1\times10^{21}$ cm$^{-3}$ or less.

The n-type drift region 26 is provided on the drain region 24. The drift region 26 is provided between the drain region 24 and the front surface of the silicon carbide layer 10.

The drift region 26 contains, for example, nitrogen (N) as n-type impurities. The n-type impurity concentration of the drift region 26 is, for example, $4\times10^{14}$ cm$^{-3}$ or more and $1\times10^{17}$ cm$^{-3}$ or less.

The p-type body region 28 is provided between the drift region 26 and the front surface of the silicon carbide layer 10. The body region 28 is provided between the first trench 22a and the second trench 22b. As illustrated in FIG. 2, a plurality of body regions 28 are arranged to be separated from each other in the first direction.

The body region 28 functions as a channel region of the MOSFET 100. For example, when the MOSFET 100 is turned on, a channel in which electrons flew is formed in a region of the body region 28 which is in contact with the first gate insulating layer 18a and a region of the body region 28 which is in contact with the second gate insulating layer 18b. The region of the body region 28 which is in contact with the first gate insulating layer 18a and the region of the body region 28 which is in contact with the second gate insulating layer 18b become channel formation regions.

The body region 28 contains, for example, aluminum (Al) as p-type impurities. The p-type impurity concentration of the body region 28 is, for example, $5\times10^{16}$ cm$^{-3}$ or more and $5\times10^{18}$ cm$^{-3}$ or less.

The depth of the body region 28 is, for example, 0.2 μm or more and 1.0 μm or less.

The n⁺-type source region 30 is provided between the body region 28 and the front surface of the silicon carbide layer 10. The source region 30 is in contact with the source electrode 12. The source region 30 is in contact with the first gate insulating layer 18a or the second gate insulating layer 18b.

A first trench 22a is interposed between the two source regions 30. A second trench 22b is interposed between the two source regions 30.

The source region 30 contains, for example, phosphorus (P) as n-type impurities. The n-type impurity concentration of the source region 30 is higher than the n-type impurity concentration of the drift region 26. The n-type impurity concentration of the source region 30 is, for example, $5\times10^{18}$ cm$^{-3}$ or more and $1\times10^{21}$ cm$^{-3}$ or less.

The depth of the source region 30 is smaller than the depth of the body region 28 and is, for example, 0.1 μm or more and 0.3 μm or less. The distance between the drift region 26 and the source region 30 in the depth direction (third direction) is, for example, 0.1 μm or more and 0.9 μm or less.

The p⁺-type contact region 38 is provided between the body region 28 and the front surface of the silicon carbide layer 10. The contact region 38 is in contact with the source electrode 12. The contact region 38 is interposed between, for example, two source regions 30.

The contact region 38 contains, for example, aluminum (Al) as p-type impurities. The p-type impurity concentration of the contact region 38 is higher than the p-type impurity concentration of the body region 28.

The p-type impurity concentration of the contact region 38 is, for example, $5\times10^{18}$ cm$^{-3}$ or more and $1\times10^{21}$ cm$^{-3}$ or less.

The p-type first electric field relaxation region 34a is provided between the first trench 22a and the back surface of the silicon carbide layer 10. The first electric field relaxation region 34a is located between the first trench 22a and the drift region 26. The first electric field relaxation region 34a is in contact with the bottom of the first trench 22a.

As illustrated in FIG. 6, the first electric field relaxation region 34a extends in the first direction along the bottom of the first trench 22a. The first electric field relaxation region 34a is in contact with the first connection region 32a.

The p-type second electric field relaxation region 34b is provided between the second trench 22b and the back surface of the silicon carbide layer 10. The second electric field relaxation region 34b is located between the second trench 22b and the drift region 26. The second electric field relaxation region 34b is in contact with the bottom of the second trench 22b.

As illustrated in FIG. 6, the second electric field relaxation region 34b extends in the first direction along the bottom of the second trench 22b. The second electric field relaxation region 34b is in contact with the second connection region 32b.

The first electric field relaxation region 34a and the second electric field relaxation region 34b contain, for example, aluminum (Al) as p-type impurities. The p-type impurity concentrations of the first electric field relaxation region 34a and the second electric field relaxation region 34b are, for example, higher than the p-type impurity concentration of the body region 28. The p-type impurity concentrations of the first electric field relaxation region 34a and the second electric field relaxation region 34b are, for example, $5\times10^{17}$ cm$^{-3}$ or more and $1\times10^{19}$ cm$^{-3}$ or less.

The thicknesses of the first electric field relaxation region 34a and the second electric field relaxation region 34b in the direction (third direction) from the front surface to the back surface are, for example, 0.1 μm or more and 0.3 μm or less.

The first electric field relaxation region 34a and the second electric field relaxation region 34b have a function of relaxing an electric field applied to the first gate insulating layer 18a and the second gate insulating layer 18b. In particular, the first electric field relaxation region 34a and the second electric field relaxation region 34b have a function of relaxing the electric field applied to the first gate insulating layer 18a at the bottom of the first trench 22a and the second gate insulating layer 18b at the bottom of the second trench 22b. The first electric field relaxation region 34a and the second electric field relaxation region 34b are fixed to the source potential through the first connection region 32a and the second connection region 32b.

The p-type first connection region 32a is located between the two body regions 28. The first connection region 32a is located between the first trench 22a and the drift region 26. The first connection region 32a is in contact with the side surface of the first trench 22a. The first connection region 32a is in contact with the first electric field relaxation region 34a.

The depth of the first connection region 32a is larger than the depth of the body region 28. The distance between the first connection region 32a and the back surface of the silicon carbide layer 10 is smaller than the distance between the body region 28 and the back surface of the silicon carbide layer 10.

The p-type second connection region 32b is located between the two body regions 28. The second connection region 32b is located between the second trench 22b and the drift region 26. The second connection region 32b is in contact with the side surface of the second trench 22b. The second connection region 32b is in contact with the second electric field relaxation region 34b.

The depth of the second connection region 32b is larger than the depth of the body region 28. The distance between the second connection region 32b and the back surface of the silicon carbide layer 10 is smaller than the distance between the body region 28 and the back surface of the silicon carbide layer 10.

The drift region 26 is interposed between the first connection region 32a and the second connection region 32b.

The first connection region 32a and the second connection region 32b contain, for example, aluminum (Al) as p-type impurities. The p-type impurity concentrations of the first connection region 32a and the second connection region 32b are, for example, higher than the p-type impurity concentration of the body region 28. The p-type impurity concentrations of the first connection region 32a and the second connection region 32b are, for example, $5 \times 10^{17}$ cm$^{-3}$ or more and $1 \times 10^{19}$ cm$^{-3}$ or less.

The first connection region 32a and the second connection region 32b have a function of electrically connecting the first electric field relaxation region 34a and the second electric field relaxation region 34b to the source electrode 12. The first electric field relaxation region 34a and the second electric field relaxation region 34b are fixed to the source potential by the first connection region 32a and the second connection region 32b.

By fixing the first electric field relaxation region 34a and the second electric field relaxation region 34b at the source potential, extraction of charges from the first electric field relaxation region 34a and the second electric field relaxation region 34b to the source electrode 12 is facilitated, and thus the dielectric breakdown of the first gate insulating layer 18a and the second gate insulating layer 18b is suppressed.

The source electrode 12 is provided on the front surface side of the silicon carbide layer 10. The source electrode 12 is provided on the front surface of the silicon carbide layer 10. The source electrode 12 is in contact with, for example, the source region 30, the drift region 26, and the contact region 38.

The source electrode 12 contains a metal. The metal constituting the source electrode 12 is, for example, a stacked structure of titanium (Ti) and aluminum (Al). The source electrode 12 may include a metal silicide for reducing the resistance of the contact resistance, for example, in a portion in contact with the source region 30 and the contact region 38. The metal silicide is, for example, nickel silicide.

The contact between the source electrode 12 and each of the source region 30 and the contact region 38 is, for example, ohmic contact. The junction between the source electrode 12 and the drift region 26 between the two body regions 28 is Schottky junction.

The drain electrode 14 is provided on the back surface side of the silicon carbide layer 10. The drain electrode 14 is provided on the back surface of the silicon carbide layer 10. The drain electrode 14 is in contact with the drain region 24.

The drain electrode 14 is, for example, a metal or a metal semiconductor compound. For example, the drain electrode 14 contains one material selected from the group consisting of nickel silicide (NiSi), titanium (Ti), nickel (Ni), silver (Ag), and gold (Au).

The width of the transistor region in the first direction is, for example, 1 or more times and 3 or less times the width of the diode region in the first direction. The width of the transistor region in the first direction is, for example, 1.5 or more times and 2.5 or less times the width of the diode region in the first direction. The width of the transistor region in the first direction is the width (w1 in FIG. 4) of the body region 28 in the first direction. The width of the diode region in the first direction is the distance between the two body regions 28, that is, the width (w2 in FIG. 4) of the drift region 26 in the first direction interposed between the two body regions 28.

Next, an example of a method of manufacturing the semiconductor device according to the first embodiment will be described with reference to FIGS. 1 to 6.

First, a silicon carbide layer 10 having an n$^+$-type drain region 24 and an n-type drift region 26 is prepared. The drift region 26 is, for example, an epitaxial layer formed on the drain region 24.

Next, a p-type body region 28, an n$^+$-type source region 30, and a p$^+$-type contact region 38 are formed in the silicon carbide layer 10 by an ion implantation method.

Next, the first trench 22a and the second trench 22b are formed in the silicon carbide layer 10 by using a known process technique.

Next, a p-type first electric field relaxation region 34a, a p-type second electric field relaxation region 34b, a p-type first connection region 32a, and a p-type second connection region 32b are formed by ion implantation method. The p-type first connection region 32a and the p-type second connection region 32b are formed by using, for example, oblique ion implantation.

After that, heat treatment for activating impurities introduced by the ion implantation method is performed on the silicon carbide layer 10.

Next, a first gate insulating layer 18a, a second gate insulating layer 18b, a first gate electrode 16a, and a second gate electrode 16b are formed in the first trench 22a and the second trench 22b by a known method.

Next, an interlayer insulating layer 20 is formed on the first gate electrode 16a and the second gate electrode 16b by using a known process technique.

Next, the source electrode 12 is formed on the front surface of the silicon carbide layer 10 by using a known process technique. In forming the source electrode 12, a metal silicide region may be selectively formed on the source region 30 and the contact region 38.

Next, a drain electrode 14 is formed on the back surface of the silicon carbide layer 10 by using a known process technique. According to the above-described manufacturing method, the MOSFET 100 illustrated in FIGS. 1 to 6 is manufactured.

Hereinafter, the functions and effects of the semiconductor device according to the first embodiment will be described.

A vertical type MOSFET using silicon carbide includes a pn junction diode as a parasitic built-in diode. In the MOSFET 100, the pn junction between body region 28 and drift region 26 is a parasitic built-in diode.

For example, the MOSFET is used as a switching element connected to an inductive load. In this case, even when the MOSFET is turned off, by using a pn junction diode, it is possible to allow a reflux current to flow.

However, when the reflux current is allowed to flow by using the pn junction diode, stacking faults grow in the silicon carbide layer due to the recombination energy of carriers generated by bipolar operation, and thus, there is a concern that the on-resistance of the MOSFET may increase. The increase in the on-resistance of the MOSFET causes degradation in the reliability of the MOSFET.

The MOSFET 100 according to the first embodiment has an SBD in which a source electrode 12 is Schottky connected to a drift region 26 as a built-in diode in a diode region. The source electrode 12 is an anode of the SBD, and the drift region 26 is a cathode of the SBD.

The SBD performs unipolar operation. Therefore, even when a reflux current flows, stacking faults do not grow in the silicon carbide layer 10 due to the recombination energy of carriers. Therefore, the reliability of the MOSFET 100 is improved.

The SBD has higher leakage current at reverse bias and lower breakdown voltage than a pn junction diode. For this reason, there is a concern that an increase in power consumption and a decrease in surge current resistance amount may occur in the MOSFET with the SBD being built in.

In the MOSFET 100 according to the first embodiment, a depletion layer extends from the first connection region 32a and the second connection region 32b to the drift region 26 when the SBD in the diode region is reversely biased. The interface between the source electrode 12 and the drift region 26 is covered with the depletion layer. Therefore, the leakage current is suppressed, and the breakdown voltage is also improved. Accordingly, degradation in the reliability due to an increase in power consumption and a decrease in surge current resistance amount is suppressed.

In the MOSFET 100 according to the first embodiment, by providing the first connection region 32a and the second connection region 32b, a so-called junction barrier Schottky (JBS) structure in which an SBC and a pn junction are combined is formed.

In the trench gate type MOSFET, the on-resistance is reduced by increasing the channel density per unit area. However, in the trench gate type MOSFET, due to the structure, a high electric field is applied to the gate insulating layer, in particular, at the bottom of the trench. Therefore, there is a concern that the dielectric breakdown voltage of the gate insulating layer may decrease. The decrease in the dielectric breakdown voltage of the gate insulating layer causes degradation in the reliability of the MOSFET.

In the MOSFET 100 according to the first embodiment, the first electric field relaxation region 34a and the second electric field relaxation region 34b are provided at the bottoms of the first trench 22a and the second trench 22b. By providing the first electric field relaxation region 34a and the second electric field relaxation region 34b, the electric field intensity applied to the first gate insulating layer 18a and the second gate insulating layer 18b is relaxed, and thus, the dielectric breakdown voltage of the gate insulating layer is increased.

However, if the first electric field relaxation region 34a and the second electric field relaxation region 34b are in the electrically floating state, the frequency responsiveness at the time of switching of the MOSFET 100 becomes deteriorates, and when the MOSFET is turned off, holes fail to be extracted from the first electric field relaxation region 34a and the second electric field relaxation region 34b, and thus, there is a concern that the dielectric breakdown of the gate insulating layer may occur.

The MOSFET 100 according to the first embodiment is provided with a first connection region 32a and a second connection region 32b connected to the first electric field relaxation region 34a and the second electric field relaxation region 34b. Therefore, the first electric field relaxation region 34a and the second electric field relaxation region 34b are electrically connected to the source electrode 12 via the first connection region 32a and the second connection region 32b.

Accordingly, at the time of switching of the MOSFET 100, holes can be extracted from the first electric field relaxation region 34a and the second electric field relaxation region 34b, through the first connection region 32a and the second connection region 32b, to the source electrode 12. Therefore, the dielectric breakdown of the gate insulating layer is suppressed, and thus, the reliability of the MOSFET 100 is improved.

Figure 7:
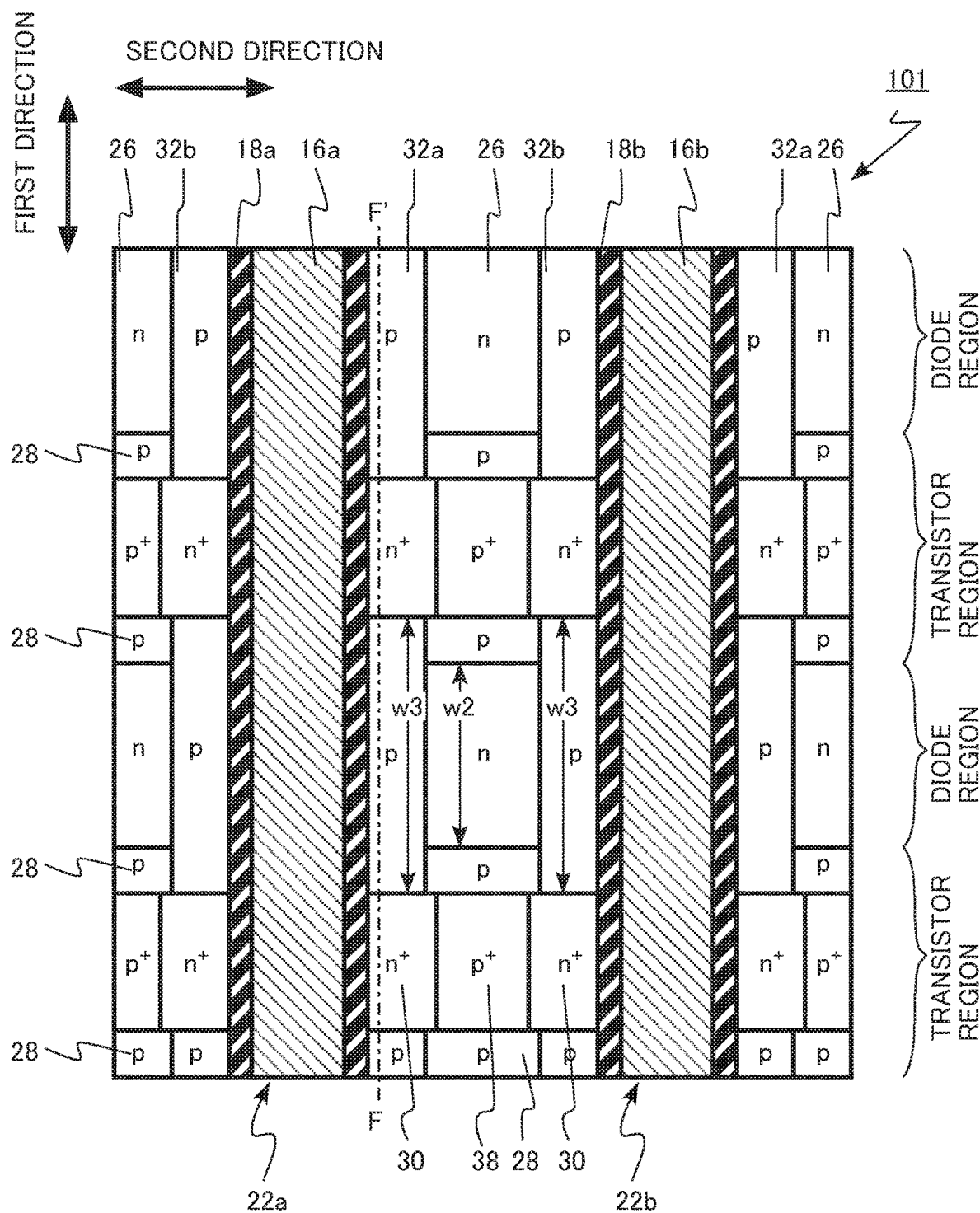
FIG. 7 is a schematic plan view of a semiconductor device according to Modified Example of the first embodiment.
Figure 8:
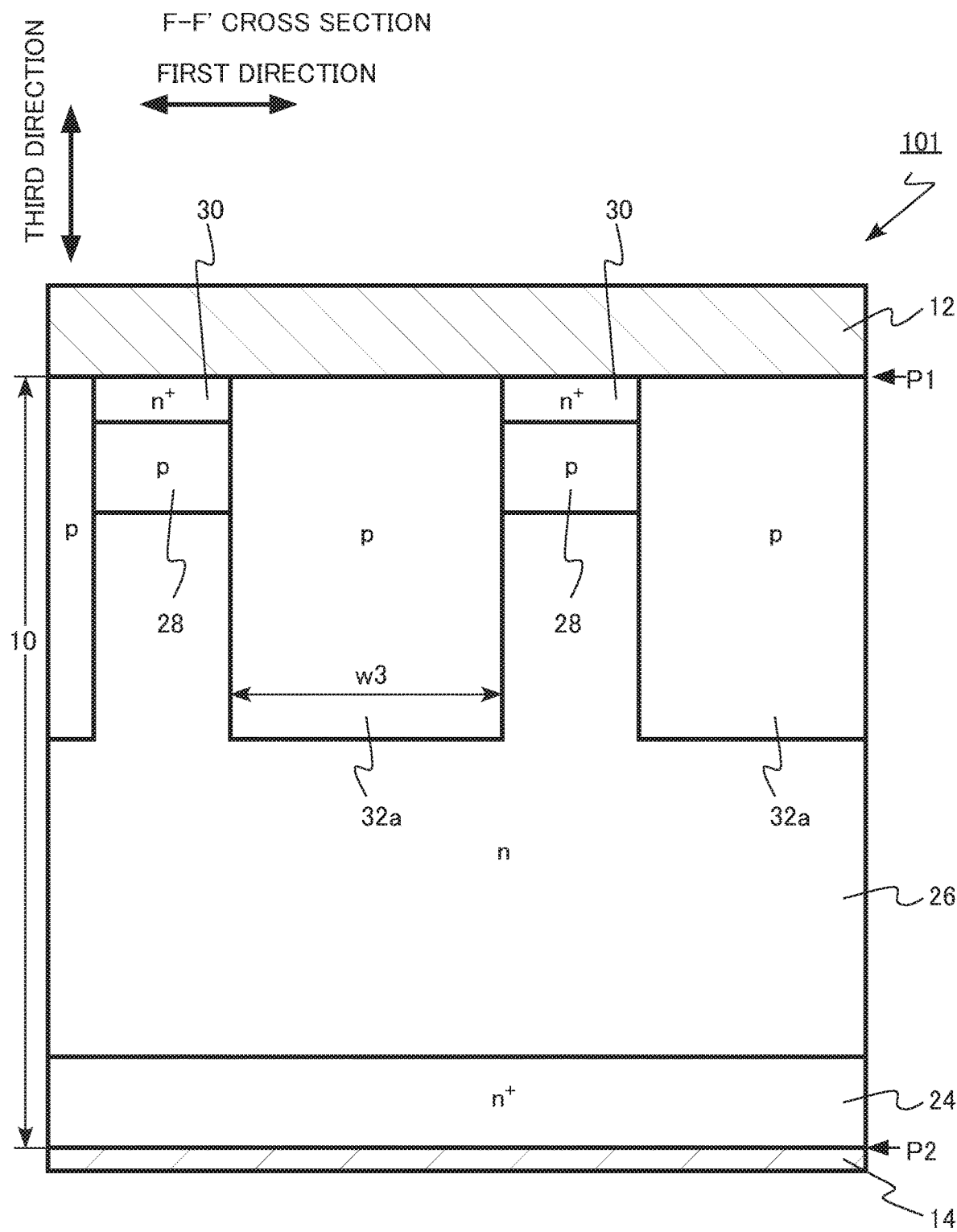
FIG. 8 is a schematic cross-sectional view of the semiconductor device according to Modified Example of the first embodiment.

FIG. 7 is a schematic plan view of a semiconductor device according to Modified Example of the first embodiment. FIG. 8 is a schematic cross-sectional view of the semiconductor device according to Modified Example of the first embodiment. FIG. 8 illustrates a cross section taken along line F-F' of FIG. 7.

A MOSFET 101 according to Modified Example is different from the MOSFET 100 according to the first embodiment in that the width (w3 in FIGS. 7 and 8) of the p-type first connection region 32a (the fourth silicon carbide region) in the first direction and the width (w3 in FIGS. 7 and 8) of the p-type second connection region 32b (the fifth silicon carbide region) in the first direction are larger than the width (w2 in FIG. 7) of the n-type drift region 26 (first silicon carbide region) in the first direction interposed by the two p-type body regions 28 (second silicon carbide regions).

According to the MOSFET 101 of Modified Example, since the width w3 of the first connection region 32a in the first direction and the width w3 of the second connection region 32b in the first direction are large, the efficiency of extraction of holes from the first electric field relaxation region 34a and the second electric field relaxation region 34b to the source electrode 12 is improved. Therefore, in comparison with the MOSFET 100 according to the first embodiment, the decrease in the gate dielectric breakdown voltage is further suppressed.

In addition, that the width of the transistor region in the first direction is preferably 1 or more times and 3 or less times the width of the diode region in the first direction, more preferably 1.5 or more times and 2.5 or less times. By satisfying the above-mentioned range, the balance between the on-current and the reflux current can be more properly maintained.

As described above, according to the first embodiment and Modified Examples, an increase in on-resistance, a reduction in avalanche withstand capability, and a reduction in gate dielectric breakdown voltage are suppressed, and thus, it is possible to realize a MOSFET with an improved reliability.

Second Embodiment

A semiconductor device according to a second embodiment is different from the semiconductor device according to the first embodiment in that an eighth silicon carbide region of the second conductivity type provided in the silicon carbide layer, located between the fourth silicon carbide region and the first plane, and having a second conductivity type impurity concentration higher than that of the fourth silicon carbide region and a ninth silicon carbide region of the second conductivity type provided in the silicon carbide layer, located between the fifth silicon carbide region and the first plane, and having a second conductivity type impurity concentration higher than that of the fifth silicon carbide region are further included. Hereinafter, redundant description of the same components as those of the first embodiment may be omitted.

Figure 9:
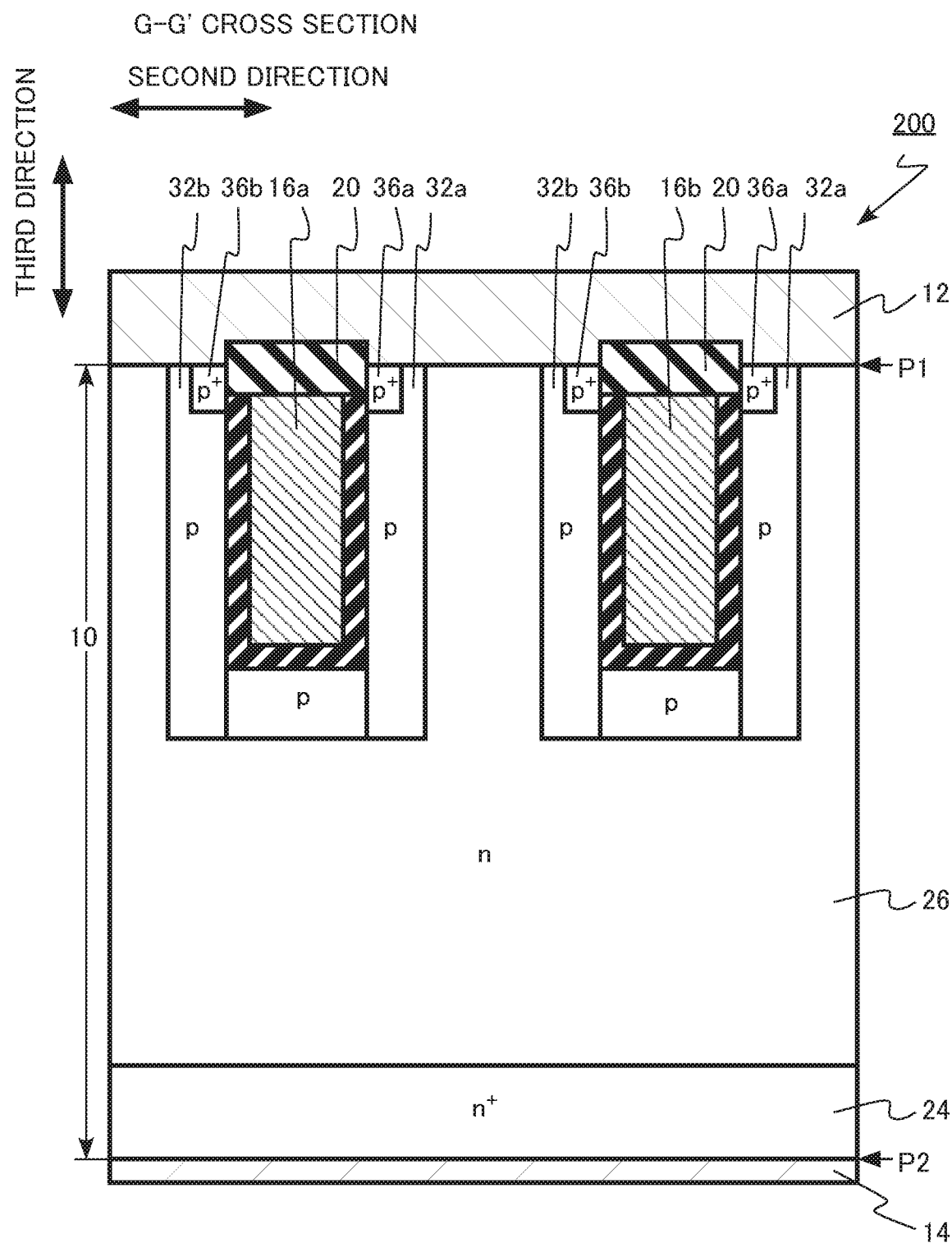
FIG. 9 is a schematic cross-sectional view of a semiconductor device according to a second embodiment.
Figure 10:
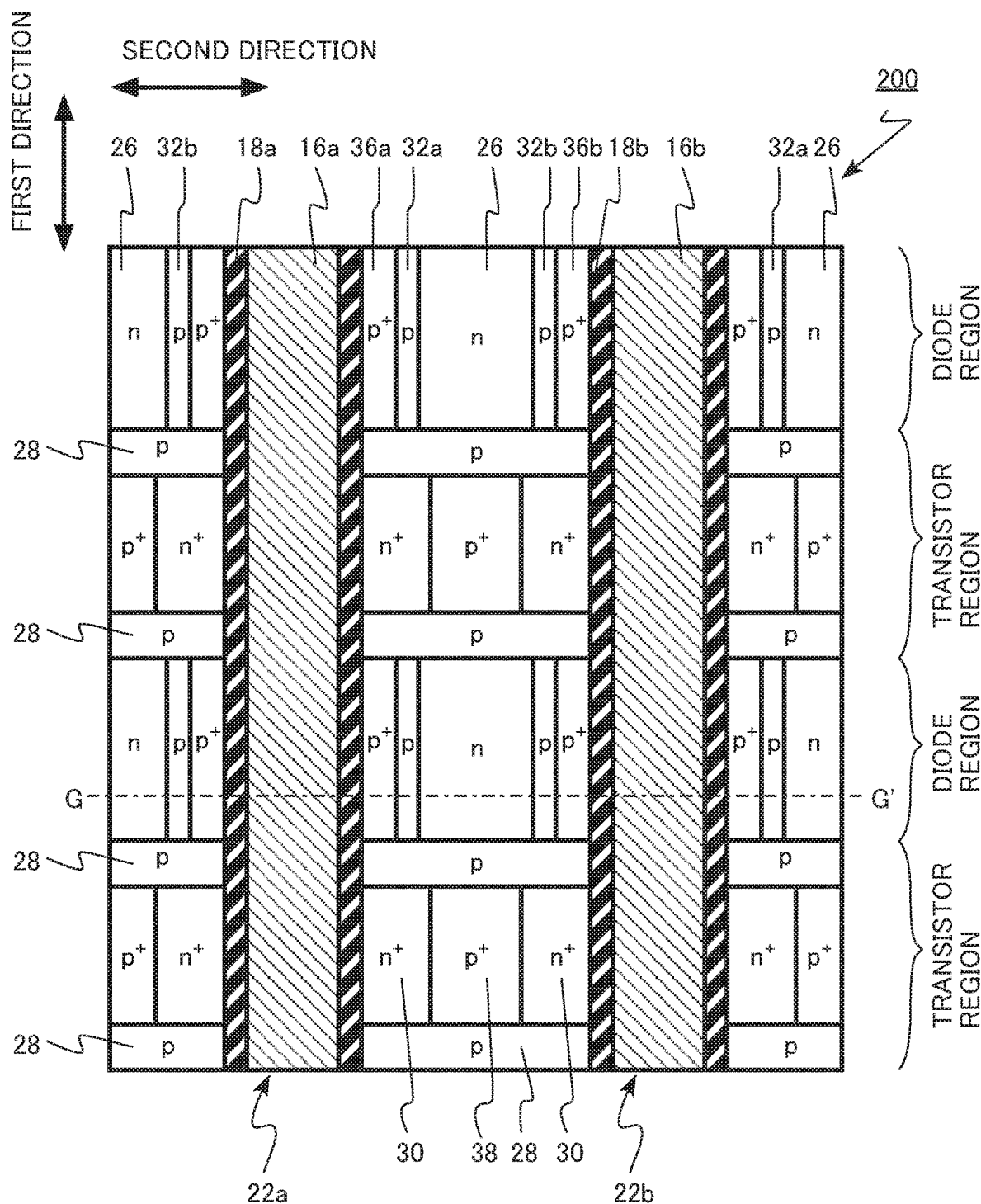
FIG. 10 is a schematic plan view of the semiconductor device according to the second embodiment.

FIG. 9 is a schematic cross-sectional view of the semiconductor device according to the second embodiment. FIG. 10 is a schematic plan view of the semiconductor device according to the second embodiment. FIG. 9 illustrates a cross section taken along line G-G' of FIG. 10. FIG. 9 is a cross-sectional view of the diode region.

The MOSFET 200 according to the second embodiment includes a p$^+$-type first high concentration region 36a (eighth silicon carbide region) and a p$^+$-type second high concentration region 36b (ninth Silicon carbide region) in the silicon carbide layer 10.

The p$^+$-type first high concentration region 36a is located between the first connection region 32a and the front surface of the silicon carbide layer 10. The first high concentration region 36a is in contact with the source electrode 12. The p-type impurity concentration of the first high concentration region 36a is higher than the p-type impurity concentration of the first connection region 32a.

The p$^+$-type second high concentration region 36b is located between the second connection region 32b and the front surface of the silicon carbide layer 10. The second high concentration region 36b is in contact with the source electrode 12. The p-type impurity concentration of the second high concentration region 36b is higher than the p-type impurity concentration of the second connection region 32b.

The first high concentration region 36a and the second high concentration region 36b contain, for example, aluminum (Al) as p-type impurities. The p-type impurity concentrations of the first high concentration region 36a and the second high concentration region 36b are, for example, $1 \times 10^{18}$ cm$^{-3}$ or more and $1 \times 10^{21}$ cm$^{-3}$ or less.

The first high concentration region 36a has a function of reducing the resistance between the source electrode 12 and the first connection region 32a. By reducing the resistance between the source electrode 12 and the first connection region 32a, the resistance between the source electrode 12 and the first electric field relaxation region 34a is also reduced.

Similarly, the second high concentration region 36b has a function of reducing resistance between the source electrode 12 and the second connection region 32b. By reducing the resistance between the source electrode 12 and the second connection region 32b, the resistance between the source electrode 12 and the second electric field relaxation region 34b is also reduced.

By reducing the resistance between the source electrode 12 and the first high concentration region 36a and the second high concentration region 36b, the efficiency of extraction holes from the first electric field relaxation region 34a and the second electric field relaxation region 34b to the source electrode 12 can be improved. Therefore, in comparison with the MOSFET 100 according to the first embodiment, the degradation in the gate dielectric breakdown voltage is further suppressed.

As described above, according to the second embodiment, similarly to the first embodiment, an increase in on-resistance and a reduction in avalanche withstand capability are suppressed, and thus, it is possible to realize a MOSFET with an improved reliability. In addition, in comparison with the first embodiment, a reduction in gate dielectric breakdown voltage is further suppressed, and thus it is possible to realize a MOSFET with a more improved reliability.

Third Embodiment

A semiconductor device according to a third embodiment is different from that of the first embodiment in that the transistor region does not include the sixth silicon carbide region and the seventh silicon carbide region. Hereinafter, redundant description of the same components as those of the first embodiment may be omitted.

Figure 11:
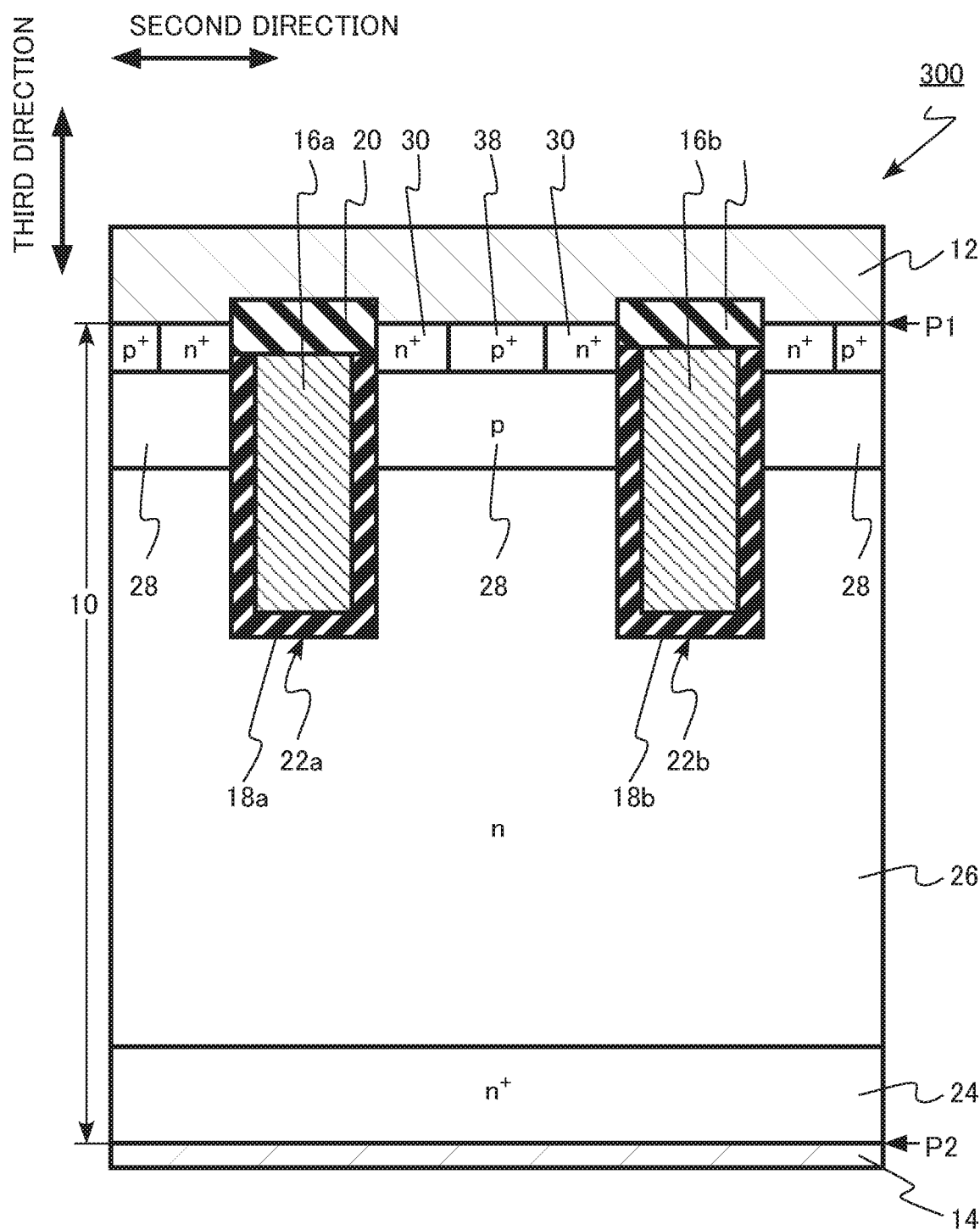
FIG. 11 is a schematic cross-sectional view of a semiconductor device according to a third embodiment.
Figure 12:
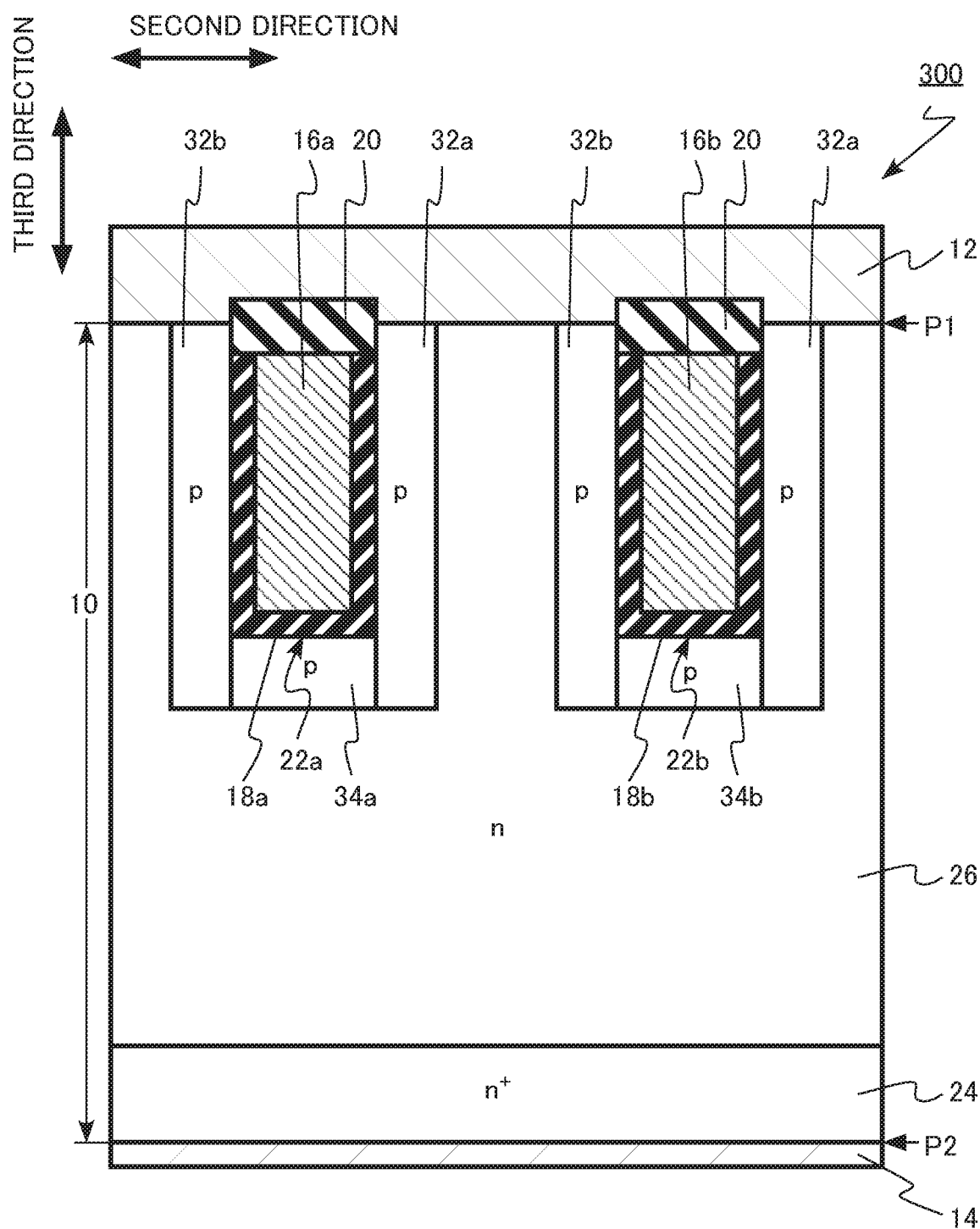
FIG. 12 is a schematic cross-sectional view of the semiconductor device according to the third embodiment.
Figure 13:
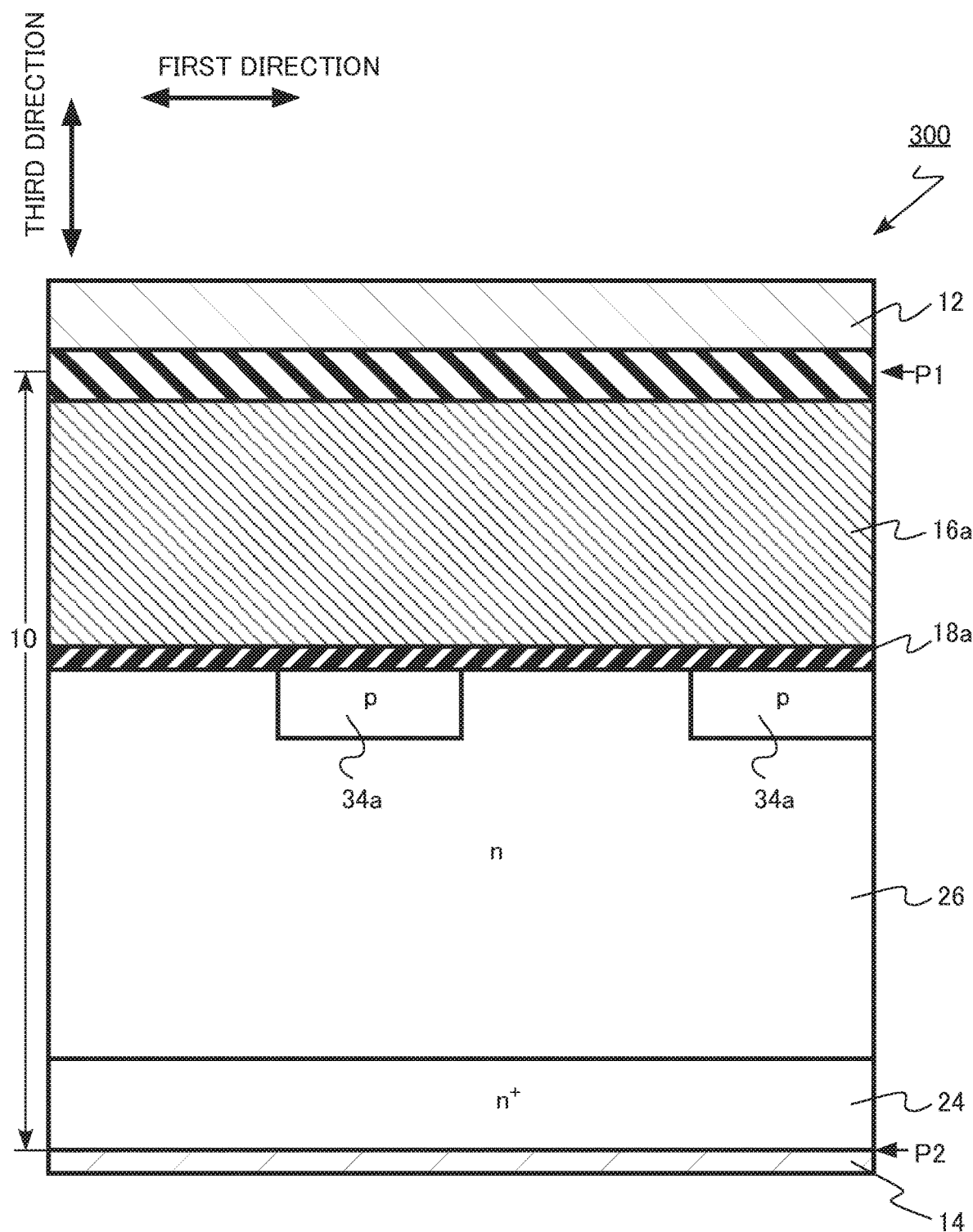
FIG. 13 is a schematic cross-sectional view of the semiconductor device according to the third embodiment.

FIG. 11 is a schematic cross-sectional view of the semiconductor device according to the third embodiment. FIG. 12 is a schematic cross-sectional view of the semiconductor device according to the third embodiment. FIG. 13 is a schematic cross-sectional view of the semiconductor device according to the third embodiment.

FIG. 11 is a view corresponding to FIG. 1 of the first embodiment. FIG. 11 is a cross-sectional view of a transistor region.

FIG. 12 is a view corresponding to FIG. 3 of the first embodiment. FIG. 12 is a cross-sectional view of a diode region.

FIG. 13 is a view corresponding to FIG. 6 of the first embodiment. FIG. 13 is a cross-sectional view taken along the first trench 22a.

In the MOSFET 300 according to the third embodiment, as illustrated in FIGS. 11 and 13, a p-type first electric field relaxation region 34a and a p-type second electric field relaxation region 34b are not provided in the silicon carbide layer 10 in the transistor region.

In the transistor region, the bottom of the first trench 22a is in contact with the drift region 26. In the transistor region, the bottom of the second trench 22b is in contact with the drift region 26.

As illustrated in FIGS. 12 and 13, the first electric field relaxation region 34a is provided between the first trench 22a and the drift region 26 in the silicon carbide layer 10 in the diode region. Similarly, the second electric field relaxation region 34b is provided between the second trench 22b and the drift region 26 in the silicon carbide layer 10 in the diode region.

In the MOSFET 300 according to the third embodiment, when the MOSFET 300 is turned off, a depletion layer extends from the first electric field relaxation region 34a and the second electric field relaxation region 34b of the diode region to the drift region 26. This depletion layer covers the interface between the first trench 22a and the drift region 26 and the interface between the second trench 22b and the drift region 26. Therefore, the electric field applied to the first gate insulating layer 18a and the second gate insulating layer 18b is relaxed. Therefore, the dielectric breakdown of the gate insulating layer is suppressed, and thus, the reliability of the MOSFET 100 is improved.

It is preferable that the width of the first electric field relaxation region 34a in the first direction and the width of the second electric field relaxation region 34b in the first direction are larger than that of the n-type drift region 26 interposed by the two p-type body regions 28 in the first direction from the viewpoint that the interface between the first trench 22a and the drift region 26 and the interface between the second trench 22b and the drift region 26 are sufficiently covered with a depletion layer.

As described above, according to the third embodiment, similarly to the first embodiment, an increase in on-resistance, a reduction in avalanche withstand capability, and a reduction in gate dielectric breakdown voltage are suppressed, and thus, it is possible to realize a MOSFET with an improved reliability.

Fourth Embodiment

A semiconductor device according to a fourth embodiment is different from that of the third embodiment in that the diode region also does not include the sixth silicon carbide region and the seventh silicon carbide region. Hereinafter, redundant description of the same components as those of the third embodiment may be omitted.

Figure 14:
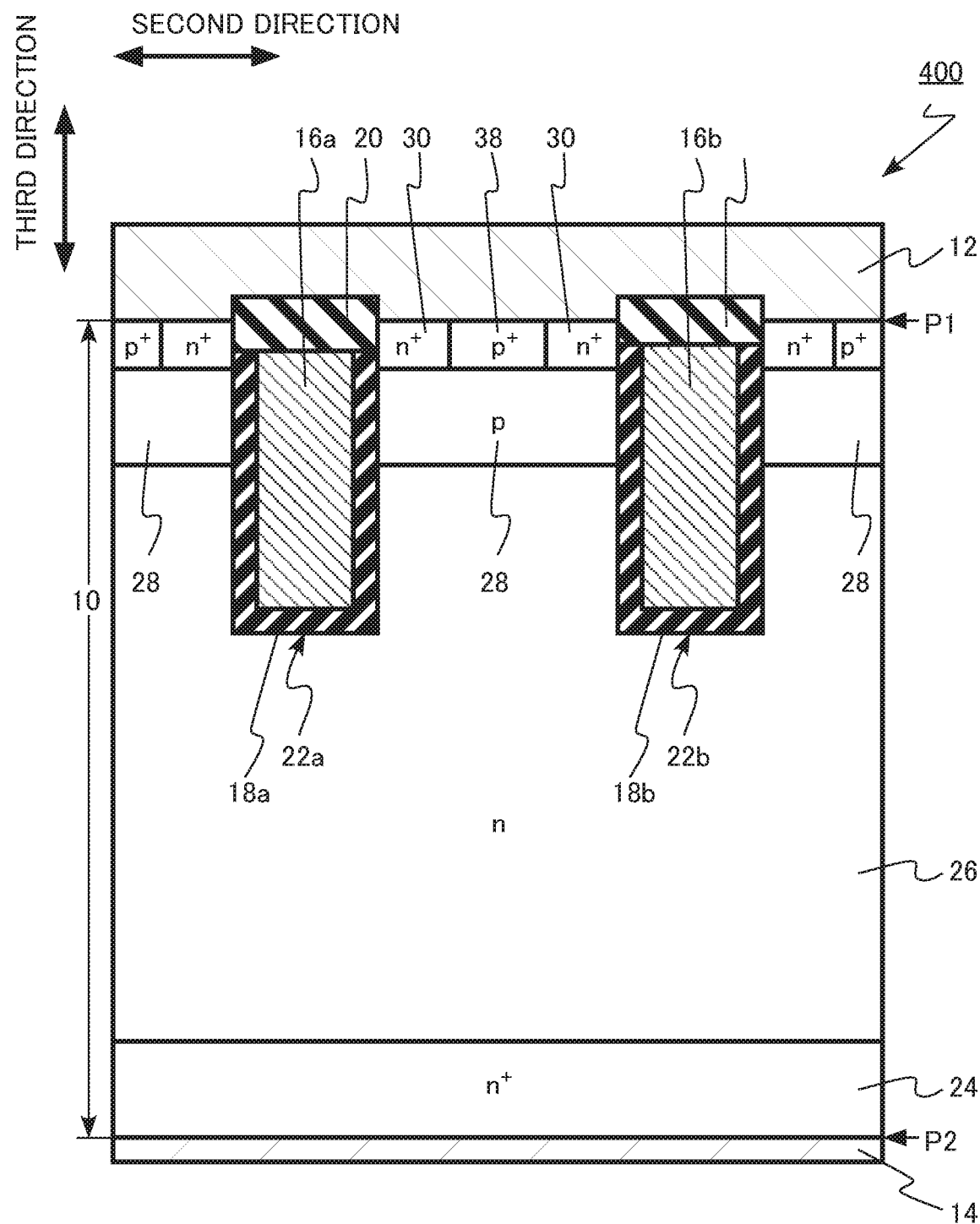
FIG. 14 is a schematic cross-sectional view of a semiconductor device according to a fourth embodiment.
Figure 15:
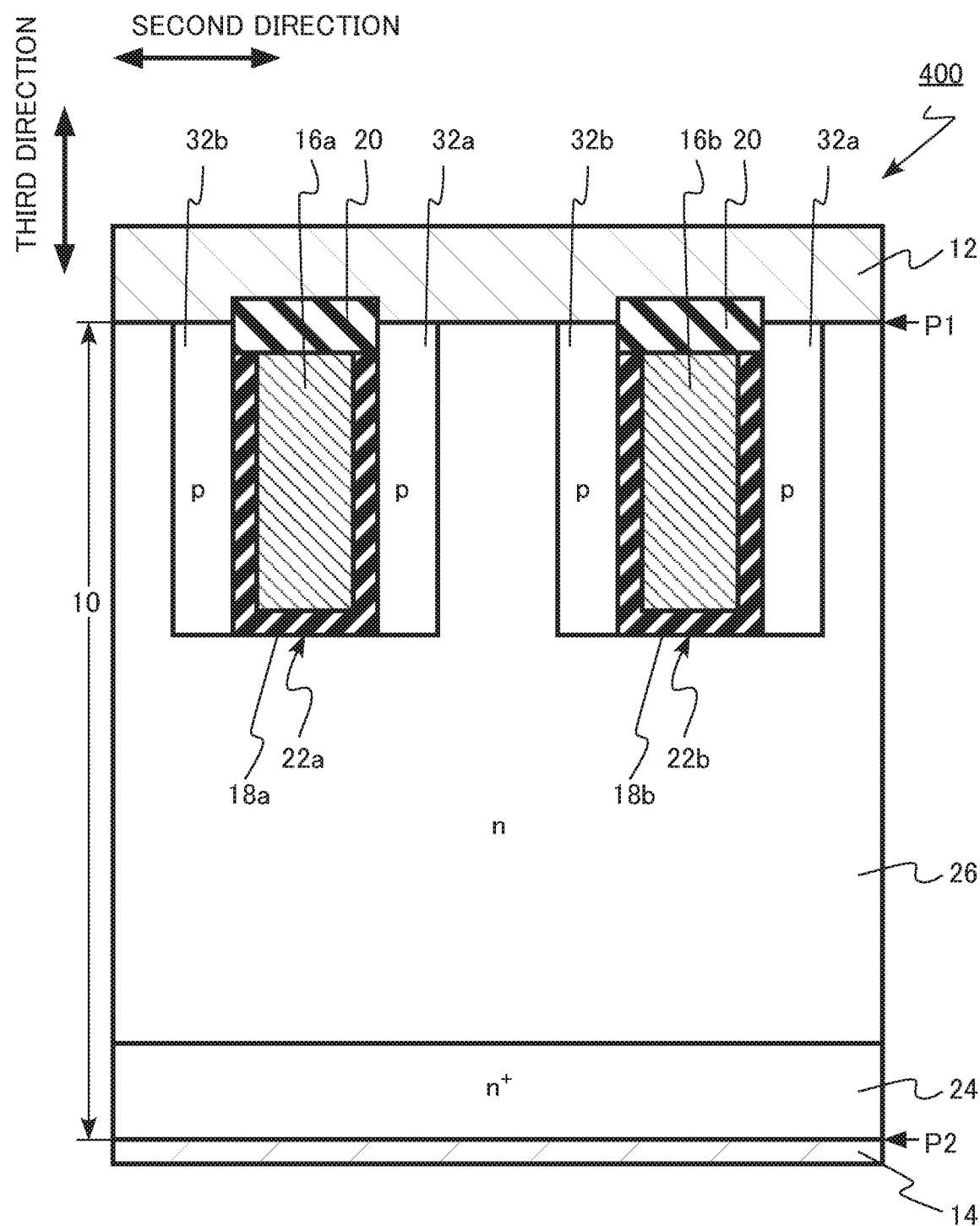
FIG. 15 is a schematic cross-sectional view of the semiconductor device according to the fourth embodiment.

FIG. 14 is a schematic cross-sectional view of the semiconductor device according to the fourth embodiment. FIG. 15 is a schematic cross-sectional view of the semiconductor device according to the fourth embodiment.

FIG. 14 is a view corresponding to FIG. 1 of the first embodiment. FIG. 14 is a cross-sectional view of a transistor region.

FIG. 15 is a view corresponding to FIG. 3 of the first embodiment. FIG. 15 is a cross-sectional view of a diode region.

In the MOSFET 400 according to the fourth embodiment, as illustrated in FIG. 14, a p-type first electric field relaxation region 34a and a p-type second electric field relaxation region 34b are not provided in the silicon carbide layer 10 in the transistor region. In addition, as illustrated in FIG. 15, the p-type first electric field relaxation region 34a and the p-type second electric field relaxation region 34b are not provided in the silicon carbide layer 10 in the diode region.

The MOSFET 400 according to the fourth embodiment has the first connection region 32a and the second connection region 32b, so that the efficiency of extraction of carriers from the bottom of the first trench 22a and the bottom of the second trench 22b at the time of the switching operation from the OFF operation to the ON operation of the MOSFET 400 is improved. Therefore, the decreasing of the resistance of the drift region 26 at the time of transition from the OFF operation to the ON operation is promptly executed, and thus, it is possible to realize the MOSFET 400 with a decreased on-resistance.

As described above, according to the fourth embodiment, similarly to the first embodiment, an increase in on-resistance and a reduction in avalanche withstand capability are suppressed, and thus, it is possible to realize a MOSFET with an improved reliability. In addition, it is possible to realize a MOSFET with a decreased on-resistance.

As described above, in the first to fourth embodiments, a case where the 4H—SiC is used as a crystal structure of the silicon carbide has been described as an example, but the invention may be applied to silicon carbide having other crystal structures such as 6H—SiC and 3C—SiC. In addition, a plane other than the (0001) plane may also be applied to the front surface of the silicon carbide layer 10.

In the first to fourth embodiments, a case where the first conductivity type is n-type and the second conductivity type is p-type has been described as an example, but the first conductivity type may be p-type and the second conductivity type may be n-type.

In the first to fourth embodiments, aluminum (Al) is exemplified as p-type impurities, but boron (B) may also be used. In addition, nitrogen (N) and phosphorus (P) are exemplified as n-type impurities, but arsenic (As), antimony (Sb), or the like may also be applied.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device comprising:
a silicon carbide layer having a first plane and a second plane opposite to the first plane;
a first trench provided in the silicon carbide layer and extending in a first direction;
a second trench provided in the silicon carbide layer and extending in the first direction;
a first gate electrode provided in the first trench;
a second gate electrode provided in the second trench;
a first gate insulating layer provided between the first gate electrode and the silicon carbide layer;
a second gate insulating layer provided between the second gate electrode and the silicon carbide layer;
a first silicon carbide region of a first conductivity type provided in the silicon carbide layer;
a plurality of second silicon carbide regions of a second conductivity type provided in the silicon carbide layer, the second silicon carbide regions located between the first silicon carbide region and the first plane, the second silicon carbide regions located between the first trench and the second trench, and the second silicon carbide regions separated from each other in the first direction;
a third silicon carbide region of the first conductivity type provided in the silicon carbide layer and the third silicon carbide region located between one of the second silicon carbide regions and the first plane;
a fourth silicon carbide region of the second conductivity type provided in the silicon carbide layer, the fourth silicon carbide region located between two of the second silicon carbide regions, the fourth silicon carbide region located between the first trench and the first silicon carbide region, and the fourth silicon carbide region being in contact with the two of the second silicon carbide regions;
a fifth silicon carbide region of the second conductivity type provided in the silicon carbide layer, the fifth silicon carbide region located between the two of the second silicon carbide regions, the fifth silicon carbide region located between the second trench and the first silicon carbide region, and the fifth silicon carbide region being in contact with the two of the second silicon carbide regions;

a first electrode provided on a side of the first plane of the silicon carbide layer, the first electrode being in contact with the third silicon carbide region, and the first electrode being in direct contact with the first silicon carbide region between the two of the second silicon carbide regions; and a second electrode provided on a side of the second plane of the silicon carbide layer, wherein the first direction is perpendicular to a second direction, and the second direction is a direction from the first trench towards the second trench.

2. The semiconductor device according to claim 1, wherein a distance between the fourth silicon carbide region and the second plane and a distance between the fifth silicon carbide region and the second plane are smaller than a distance between the second silicon carbide region and the second plane.

3. The semiconductor device according to claim 1, further comprising:

a sixth silicon carbide region of the second conductivity type provided in the silicon carbide layer, the sixth silicon carbide region located between the first trench and the second plane, the sixth silicon carbide region located between the first trench and the first silicon carbide region, the sixth silicon carbide region being in contact with the fourth silicon carbide region, and the sixth silicon carbide region extending in the first direction; and a seventh silicon carbide region of the second conductivity type provided in the silicon carbide layer, the seventh silicon carbide region located between the second trench and the second plane, the seventh silicon carbide region located between the second trench and the first silicon carbide region, the seventh silicon carbide region being in contact with the fifth silicon carbide region, and the seventh silicon carbide region extending in the first direction.

4. The semiconductor device according to claim 1, further comprising:

an eighth silicon carbide region of the second conductivity type provided in the silicon carbide layer, the eighth silicon carbide region located between the fourth silicon carbide region and the first plane, and the eighth silicon carbide region having a second conductivity type impurity concentration higher than a second conductivity type impurity concentration of the fourth silicon carbide region; and a ninth silicon carbide region of the second conductivity type provided in the silicon carbide layer, the ninth silicon carbide region located between the fifth silicon carbide region and the first plane, and the ninth silicon carbide region having a second conductivity type impurity concentration higher than a second conductivity type impurity concentration of the fifth silicon carbide region.

5. The semiconductor device according to claim 1, further comprising:

a tenth silicon carbide region of the second conductivity type provided in the silicon carbide layer, the tenth silicon carbide region located between the second silicon carbide region and the first plane, and the tenth silicon carbide region having a second conductivity type impurity concentration higher than a second conductivity type impurity concentration of the second silicon carbide region.

6. The semiconductor device according to claim 1, wherein a second conductivity type impurity concentration of the fourth silicon carbide region and a second conductivity type impurity concentration of the fifth silicon carbide region are higher than a second conductivity type impurity concentration of the second silicon carbide region.

7. The semiconductor device according to claim 1, wherein a width of the fourth silicon carbide region in the first direction and a width of the fifth silicon carbide region in the first direction are larger than a width of the first silicon carbide region in the first direction interposed between two of the second silicon carbide regions.

8. The semiconductor device according to claim 1, wherein junction between the first electrode and the first silicon carbide region is Schottky junction.

9. The semiconductor device according to claim 1, wherein the first gate insulating layer and the second gate insulating layer include a silicon oxide containing nitrogen.

10. The semiconductor device according to claim 1, wherein the first conductivity type is n-type, and the second conductivity type is p-type.

* * * * *